US009825156B2

(12) United States Patent
Sasaki et al.

(10) Patent No.: US 9,825,156 B2
(45) Date of Patent: Nov. 21, 2017

(54) COMPOUND SEMICONDUCTOR DEVICE

(71) Applicant: MURATA MANUFACTURING CO., LTD., Kyoto-fu (JP)

(72) Inventors: Kenji Sasaki, Kyoto-fu (JP); Kingo Kurotani, Kyoto-fu (JP); Takashi Kitahara, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/932,497

(22) Filed: Nov. 4, 2015

(65) Prior Publication Data
US 2016/0155830 A1 Jun. 2, 2016

(30) Foreign Application Priority Data
Nov. 27, 2014 (JP) ................................ 2014-240327

(51) Int. Cl.
 *H01L 29/737* (2006.01)
 *H03F 3/19* (2006.01)
 (Continued)

(52) U.S. Cl.
 CPC ...... *H01L 29/7371* (2013.01); *H01L 23/4824* (2013.01); *H01L 23/535* (2013.01);
 (Continued)

(58) Field of Classification Search
 CPC . H01L 29/7371; H01L 23/66; H01L 25/0655; H01L 2924/0002; H03F 3/19; H03F 2200/408; H03F 2200/451
 (Continued)

(56) References Cited

U.S. PATENT DOCUMENTS

| 5,734,193 | A | * | 3/1998 | Bayraktaroglu .... H01L 21/8252 257/197 |
| 6,034,383 | A | * | 3/2000 | Bayraktaroglu .... H01L 29/0692 257/197 |
| 7,282,997 | B2 | * | 10/2007 | Salove .................. H03F 1/3282 330/207 P |
| 7,705,425 | B2 | * | 4/2010 | Ma ...................... H01L 29/0692 257/587 |
| 2004/0061131 | A1 | | 4/2004 | Winslow |
| 2006/0249752 | A1 | * | 11/2006 | Asano ................. H01L 27/0605 257/197 |
| 2006/0267148 | A1 | * | 11/2006 | Ma ...................... H01L 29/0692 257/566 |

(Continued)

FOREIGN PATENT DOCUMENTS

| JP | 2000-106386 A | 4/2000 |
| JP | 2001-044214 A | 2/2001 |

(Continued)

OTHER PUBLICATIONS

An Office Action; "Notice of Reasons for Rejection," issued by the Japanese Patent Office dated Aug. 10, 2016, which corresponds to Japanese Patent Application No. 2014-240327 and is related to U.S. Appl. No. 14/932,497; with English language translation.

*Primary Examiner* — Yasser A Abdelaziez
(74) *Attorney, Agent, or Firm* — Studebaker & Brackett PC (57) ABSTRACT

A compound semiconductor device includes a heterojunction bipolar transistor and a bump. The heterojunction bipolar transistor includes a plurality of unit transistors. The bump is electrically connected to emitters of the plurality of unit transistors. The plurality of unit transistors are arranged in a first direction. The bump is disposed above the emitters of the plurality of unit transistors while extending in the first direction. The emitter of at least one of the plurality of unit transistors is displaced from a center line of the bump in the first direction toward a first side of a second direction which is perpendicular to the first direction. The emitter of at least another one of the plurality of unit transistors is displaced from the center line of the bump in the first direction toward a second side of the second direction.

20 Claims, 12 Drawing Sheets

(51) Int. Cl.
  *H01L 23/535* (2006.01)
  *H01L 27/082* (2006.01)
  *H01L 29/40* (2006.01)
  *H01L 23/482* (2006.01)
  *H01L 23/00* (2006.01)

(52) U.S. Cl.
  CPC .......... *H01L 24/13* (2013.01); *H01L 27/0823* (2013.01); *H01L 29/40* (2013.01); *H03F 3/19* (2013.01); *H01L 24/05* (2013.01); *H01L 24/16* (2013.01); *H01L 2224/0401* (2013.01); *H01L 2224/1302* (2013.01); *H01L 2224/13013* (2013.01); *H01L 2224/16227* (2013.01); *H01L 2924/13051* (2013.01); *H03F 2200/408* (2013.01); *H03F 2200/451* (2013.01)

(58) Field of Classification Search
  USPC .......................................................... 257/197
  See application file for complete search history.

(56) References Cited

U.S. PATENT DOCUMENTS

| | | | |
|---|---|---|---|
| 2007/0205432 A1* | 9/2007 | Tsukao | ............. H01L 29/41708 257/183 |
| 2010/0109052 A1 | 5/2010 | Nakajima et al. | |
| 2014/0002188 A1 | 1/2014 | Chen et al. | |
| 2015/0326181 A1 | 11/2015 | Chen et al. | |
| 2015/0326182 A1 | 11/2015 | Chen et al. | |
| 2015/0326183 A1 | 11/2015 | Chen et al. | |

FOREIGN PATENT DOCUMENTS

| | | |
|---|---|---|
| JP | 2004-095714 A | 3/2004 |
| JP | 2008-131017 A | 6/2008 |
| JP | 2010-267944 A | 11/2010 |
| TW | 200405651 A | 4/2004 |
| TW | 201415790 A | 4/2014 |

* cited by examiner

COMPOUND SEMICONDUCTOR DEVICE

CROSS REFERENCE TO RELATED APPLICATIONS

This application claims benefit of priority to Japanese Patent Application 2014-240327 filed Nov. 27, 2014, the entire content of which is incorporated herein by reference.

TECHNICAL FIELD

The present disclosure relates to a compound semiconductor device and a power amplifier module.

BACKGROUND

In a mobile communication device, such as a cellular phone, a power amplifier module is used for amplifying power of a radio-frequency (RF) signal to be transmitted to a base station. In a power amplifier module, a compound semiconductor device including a heterojunction bipolar transistor (HBT) as an amplifier element is used.

In accordance with smaller sizes of recent mobile communication devices, it is also desirable to reduce the size of compound semiconductor devices. In order to satisfy this demand, as disclosed in Japanese Unexamined Patent Application Publication No. 2000-106386, for example, flip-chip mounting may be used instead of wire bonding as a technique for mounting a compound semiconductor device on a module substrate.

SUMMARY

In the configuration disclosed in the above-described publication, a plurality of unit transistors are linearly arranged, and a bump is provided over the emitters of the unit transistors. With this configuration, the emitters, which are heat sources, are disposed close to each other. This may increase the thermal resistance.

The present disclosure has been made in view of the above-described background. It is an object of the present disclosure to reduce the thermal resistance in a compound semiconductor device including an HBT constituted by a plurality of unit transistors.

According to a preferred embodiment of the present disclosure, there is provided a compound semiconductor device including a heterojunction bipolar transistor and a bump. The heterojunction bipolar transistor includes a plurality of unit transistors. The bump is electrically connected to emitters of the plurality of unit transistors. The plurality of unit transistors are arranged in a first direction. The bump is disposed above the emitters of the plurality of unit transistors while extending in the first direction. The emitter of at least one of the plurality of unit transistors is displaced from a center line of the bump in the first direction toward a first side of a second direction which is perpendicular to the first direction. The emitter of at least another one of the plurality of unit transistors is displaced from the center line of the bump in the first direction toward a second side of the second direction.

According to a preferred embodiment of the present disclosure, it is possible to reduce the thermal resistance in a compound semiconductor device including an HBT constituted by a plurality of unit transistors.

Other features, elements, characteristics and advantages of the present disclosure will become more apparent from the following detailed description of preferred embodiments of the present disclosure with reference to the attached drawings.

DETAILED DESCRIPTION

Figure 1:
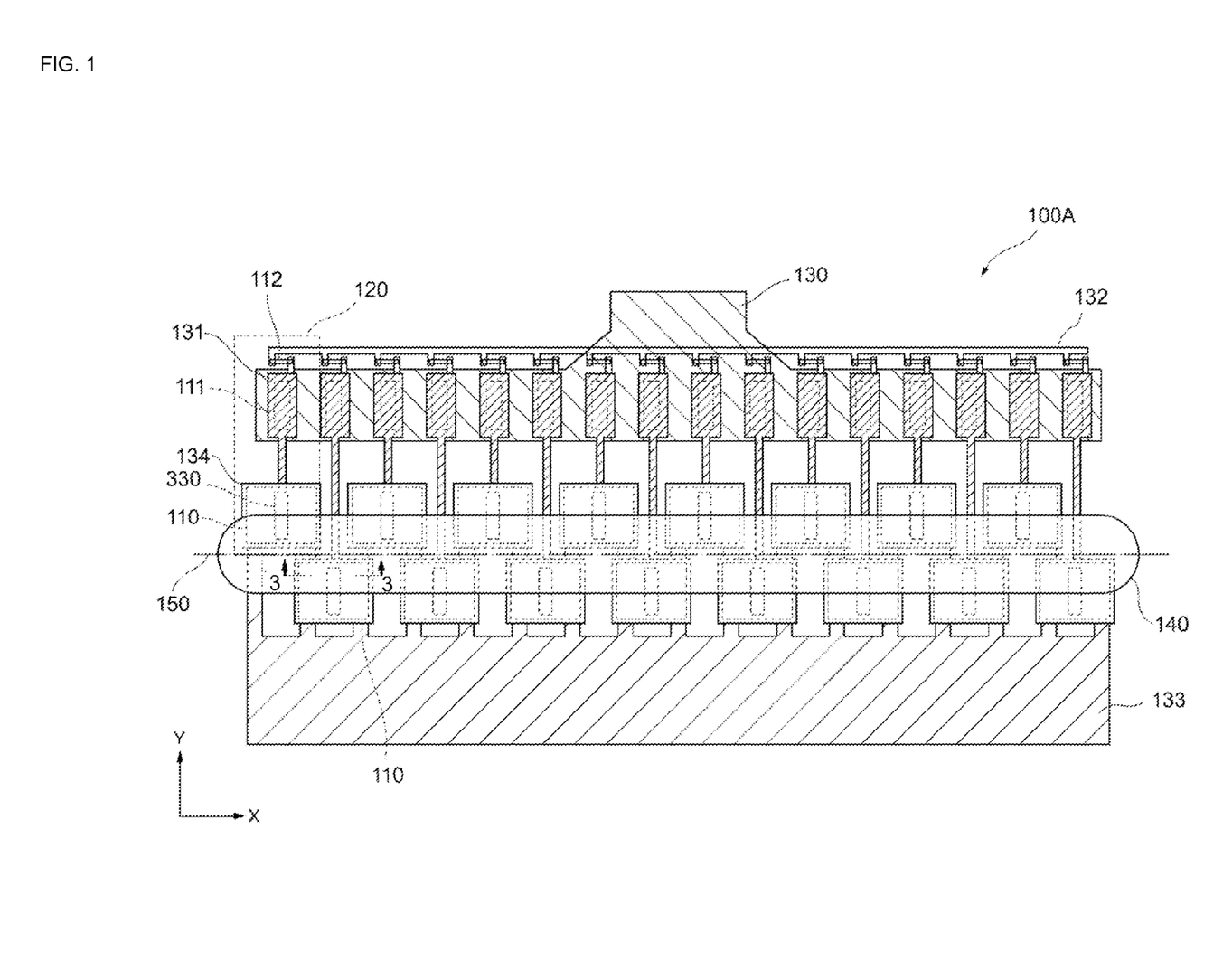
FIG. 1 is a plan view of a compound semiconductor device according to an embodiment of the disclosure.
Figure 2:
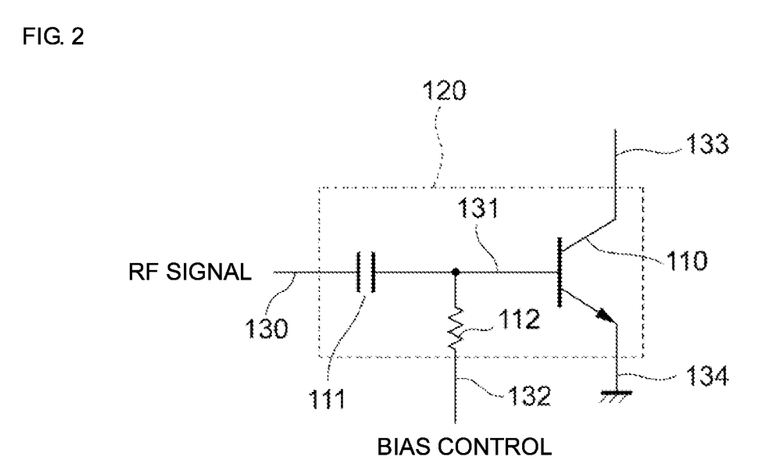
FIG. 2 is a circuit diagram of a cell forming the compound semiconductor device shown in FIG. 1.
Figure 3:
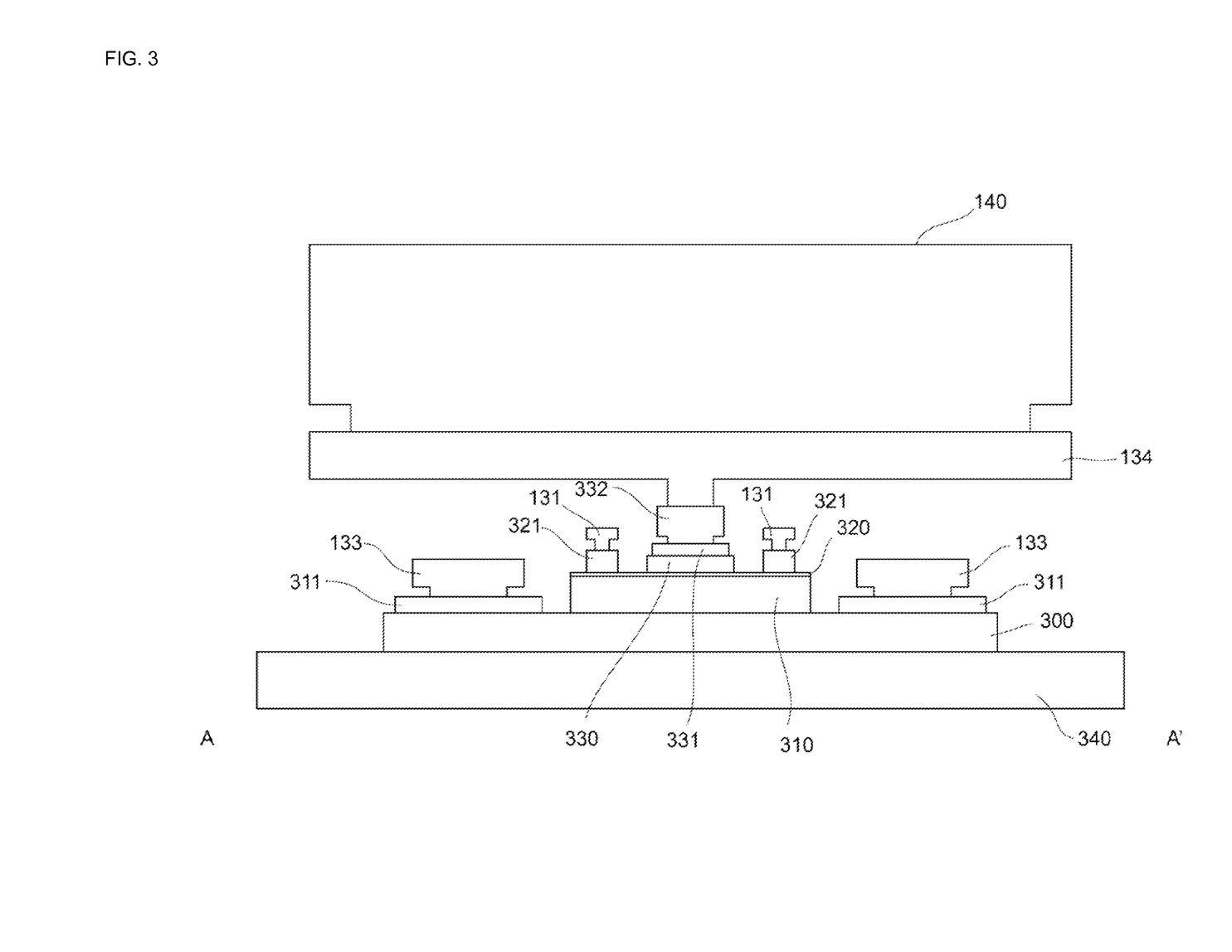
FIG. 3 is a sectional view of the compound semiconductor device taken along line 3-3 of FIG. 1.
Figure 4:
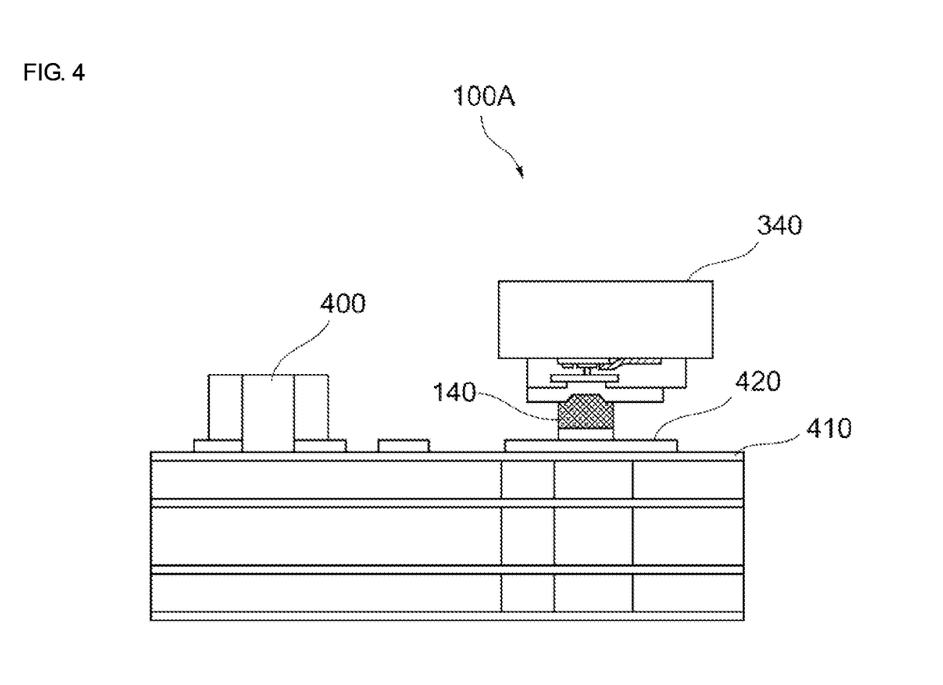
FIG. 4 illustrates an example in which the compound semiconductor device is flip-chip mounted.

FIG. 1 is a plan view of a compound semiconductor device 100A according to an embodiment of the disclosure. FIG. 2 is a circuit diagram of a cell forming the compound semiconductor device 100A. FIG. 3 is a sectional view of the compound semiconductor device 100A taken along line 3-3 of FIG. 1. FIG. 4 illustrates an example in which the compound semiconductor device 100A is flip-chip mounted. An example of the configuration of the compound semiconductor device 100A will be described below with reference to FIGS. 1 through 4.

As shown in FIG. 1, the compound semiconductor device 100A includes a plurality of unit transistors 110. These unit transistors 110 form an HBT. The unit transistors 110 are also called "fingers". In the example shown in FIG. 1, sixteen unit transistors 110 form an HBT. That is, the number of fingers of the HBT is sixteen. However, the number of fingers of the HBT is not restricted to sixteen.

Each unit transistor 110 forms a cell 120, together with a capacitor 111 and a resistor 112. The circuit diagram of the cell 120 is shown in FIG. 2. Each cell 120 amplifies an input RF signal and outputs an amplified RF signal from the collector of the unit transistor 110. A plurality of cells 120 are connected in parallel with each other and form an amplifier which amplifies an RF signal.

The capacitor 111 is formed between an RF input wire 130 into which an RF signal is input and a base wire 131 connected to the base of the unit transistor 110. The capacitor 111 may be formed as a metal-insulator-metal (MIM) capacitor between the RF input wire 130 and the base wire 131. The capacitor 111 blocks DC components of an RF signal and outputs the RF signal.

The resistor 112 is connected at one end to a bias control wire 132 and at the other end to the base wire 131. Bias is applied to the base of the unit transistor 110 via this resistor 112.

The base of the unit transistor 110 is connected to the base wire 131. The collector of the unit transistor 110 is connected to a collector wire 133. The emitter of the unit transistor 110 is connected to an emitter wire 134. As shown in FIG. 1, the emitter wire 134 is connected to a bump 140. The bump 140 is grounded, so that the emitter of the unit transistor 110 is also grounded.

The sectional structure of the unit transistor 110 will be discussed below with reference to FIG. 3. The unit transistor 110 includes a sub-collector 300, a collector 310, a collector electrode 311, a base 320, a base electrode 321, an emitter 330, and an emitter electrode 331.

The sub-collector 300 is formed on, for example, a gallium arsenide (GaAs) substrate 340. The collector 310 and the collector electrode 311 are formed on the sub-collector 300. The base 320 is formed on the collector 310. The base electrode 321 is formed on the base 320.

As shown in FIG. 3, the collector 310 is electrically connected to the collector wire 133 via the sub-collector 300 and the collector electrode 311. The base 320 is electrically connected to the base wire 131 via the base electrode 321. The emitter 330 is electrically connected to the bump 140 via the emitter electrode 331 and emitter wires 134 and 332. As shown in FIG. 3, the bump 140 is formed above the emitter 330.

As shown in FIG. 4, the compound semiconductor device 100A is mounted on a module substrate 410, together with a surface mount device (SMD) 400, for example. The compound semiconductor device 100A is mounted on the module substrate 410 with the bump 140 facing down the module substrate 410. The bump 140 is connected to a ground surface 420.

The positional relationship between the unit transistors 110 and the bump 140 in the compound semiconductor device 100A will be discussed below. As shown in FIG. 1, the multiple unit transistors 110 are arranged in the X-axis direction (first direction) shown in FIG. 1. The bump 140 is formed over the emitters 330 of the multiple unit transistors 110 and extends in the X-axis direction. As viewed from the bump 140, the emitter 330 of each unit transistor 110 is at least partially covered by the bump 140. The emitters 330 of the multiple unit transistors 110 are displaced from a center line 150 of the bump 140 alternately toward one side (first side), for example, the +Y side, and the other side (second side), for example, the −Y side, in the Y-axis direction (second direction) shown in FIG. 1.

With this arrangement, the positions of heat sources (emitters 330) can be distributed more separately than a case in which the emitters 330 of all the unit transistors 110 are linearly arranged along the center line 150 of the bump 140. This makes it possible to reduce the thermal resistance in the compound semiconductor device 100A.

As shown in FIG. 1, in the compound semiconductor device 100A, part of the emitter 330 of each unit transistor 110 is not covered by the bump 140. With this configuration, stress to be applied to the emitters 330 can be reduced compared with a case in which the emitters 330 are entirely covered by the bump 140, thereby making it possible to prolong the life of the unit transistors 110.

A description will now be given below, with reference to FIGS. 5A through 6, how the thermal resistance changes according to the positional relationship between the bump 140 and the emitters 330.

Figure 5A:
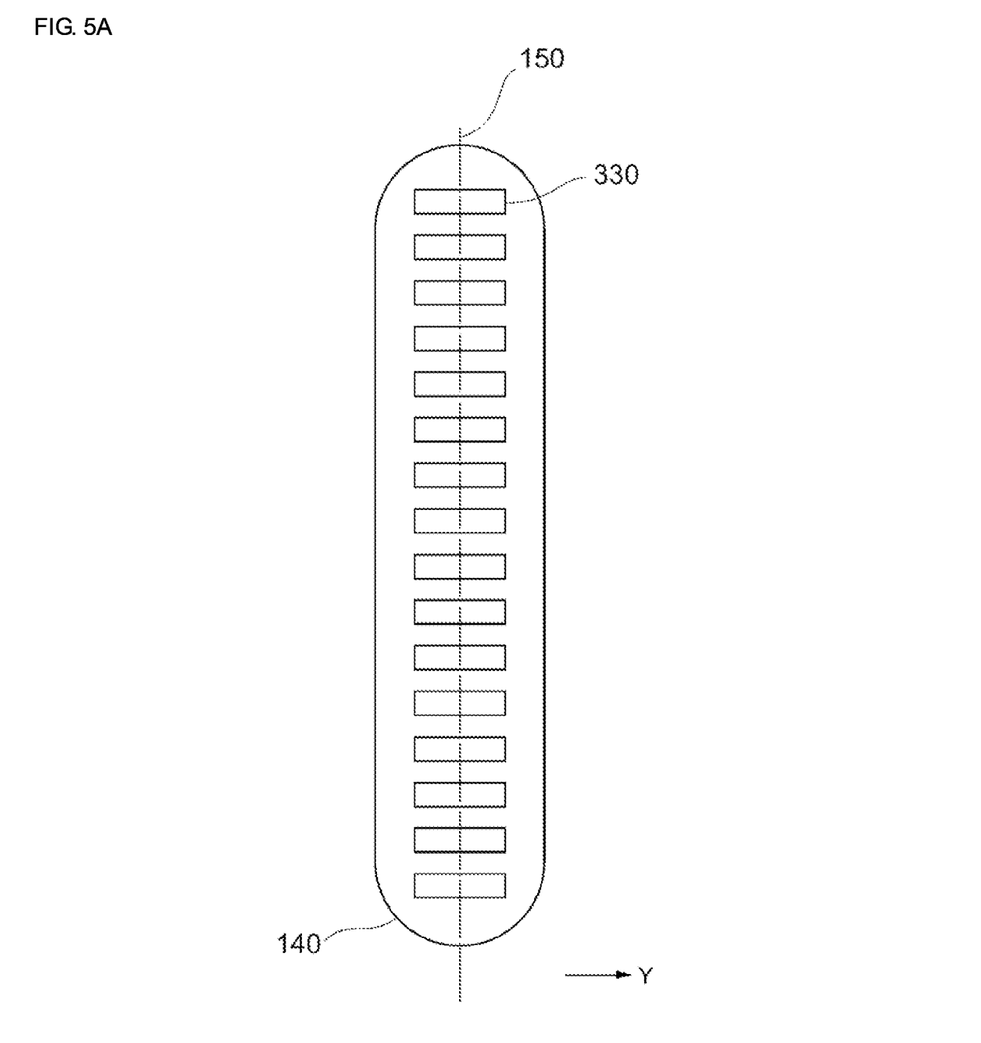
FIG. 5A illustrates an example in which emitters are linearly arranged on the center line of a bump (linear arrangement).

FIG. 5A illustrates an example in which the emitters 330 are linearly arranged on the center line 150 of the bump 140 (linear arrangement). FIG. 5B illustrates an example in which the emitters 330 are displaced from the center line 150 of the bump 140 toward one side (+Y side) (linear arrangement). FIG. 5C illustrates an example in which the emitters 330 are displaced from the center line 150 of the bump 140 alternately toward one side (+Y side) and the other side (−Y side), as in the compound semiconductor device 100A.

Figure 5B:
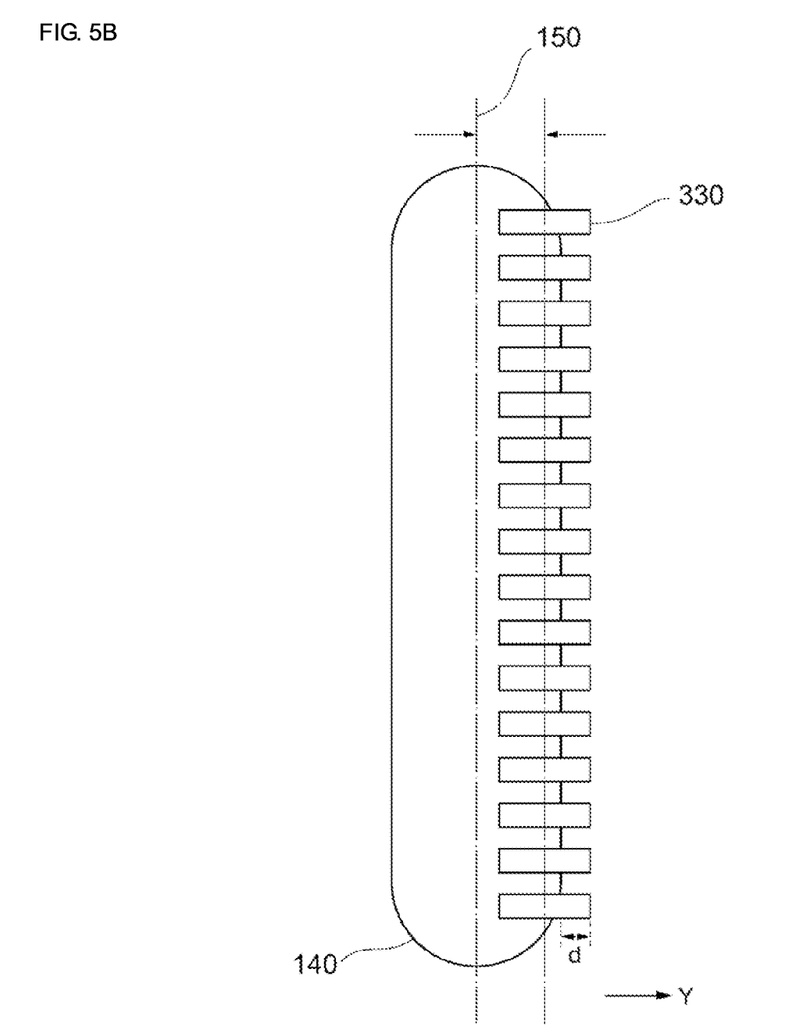
FIG. 5B illustrates an example in which emitters are displaced from the center line of a bump toward one side (+Y side) (linear arrangement).
Figure 5C:
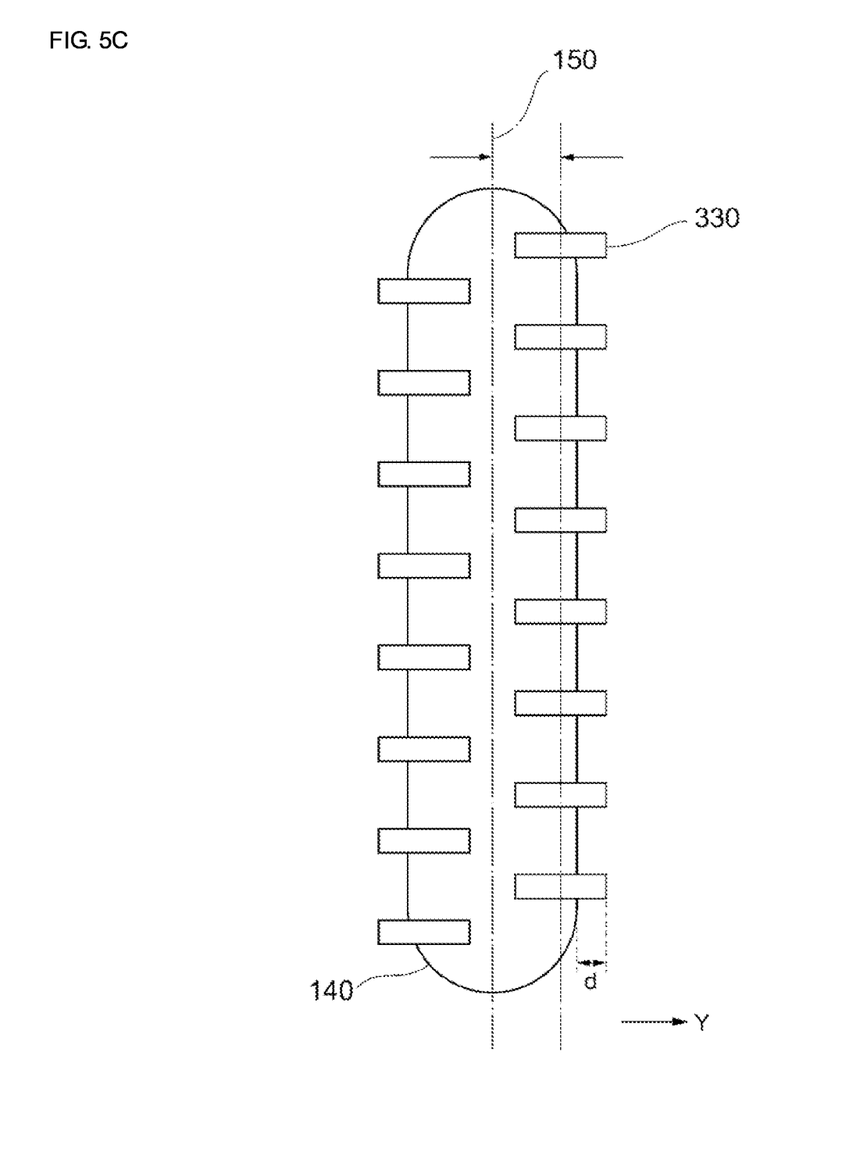
FIG. 5C illustrates an example in which emitters are displaced from the center line of a bump alternately toward one side (+Y side) and the other side (−Y side).
Figure 6:
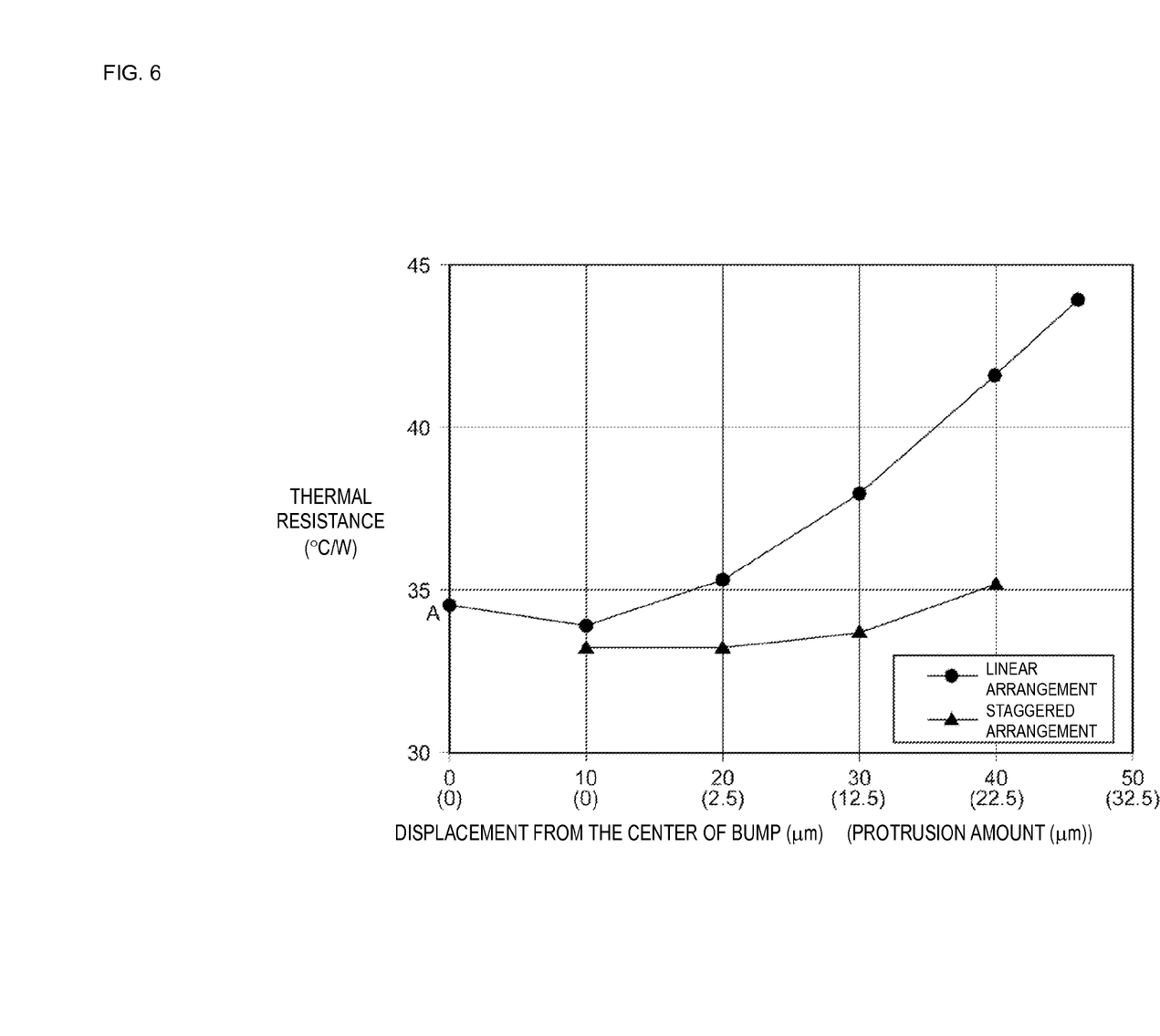
FIG. 6 is a graph illustrating simulation results indicating how the thermal resistance changes according to the amount by which emitters are displaced from the center line of a bump.

FIG. 6 is a graph illustrating simulation results indicating how the thermal resistance changes according to the amount by which the emitters 330 are displaced from the center line 150 of the bump 140 (hereinafter such an amount will simply be called a displacement). In FIG. 6, the horizontal axis indicates the displacement (distance) (μm) between the center of the emitter 330 and the center line 150 of the bump 140, while the vertical axis indicates the thermal resistance (° C./W). In FIG. 6, the line represented by the solid circles (linear arrangement) corresponds to the arrangements shown in FIGS. 5A and 5B, and the line represented by the solid triangles (staggered arrangement) corresponds to the arrangement shown in FIG. 5C.

The simulations were carried out under the following conditions: the dimension of the bump 140 in the Y-axis direction was about 75 μm, and the dimension of the emitters 330 in the Y-axis direction was about 40 μm; and the displacement of the emitters 330 was varied to about 0 μm, 10 μm, 20 μm, 30 μm, 40 μm, and 50 μm.

When the displacement of the emitters 330 is about 0 μm, 10 μm, 20 μm, 30 μm, 40 μm, and 50 μm, the amount by which the emitters 330 protrude from the edge of the bump 140 (protrusion amount d) is about 0 μm, 0 μm, 2.5 μm, 12.5 μm, 22.5 μm, and 32.5 μm, respectively.

As shown in FIG. 6, in the case of the linear arrangement, when the displacement of the emitters 330 is increased, as in FIG. 5B, to about 10 μm, the thermal resistance becomes slightly smaller than that in a case in which the emitters 330 are not displaced at all (point A in FIG. 6). However, as the displacement of the emitters 330 is further increased, the thermal resistance becomes higher.

In contrast, as shown in FIG. 6, in the case of the staggered arrangement, when the displacement of the emitters 330 is about 10 μm, 20 μm, and 30 μm, the thermal resistance is smaller than that in a case in which the emitters 330 are not displaced at all (point A in FIG. 6).

The above-described simulation results show that, by displacing the emitters 330 from the center line 150 of the bump 140 toward one side (+Y side) and the other side (−Y side), it is possible to reduce the thermal resistance to a smaller level than that in a case in which the emitters 330 are not displaced at all (point A).

The above-described simulation results also show that, in the case of the staggered arrangement, when the protrusion amount d of the emitters 330 is about 2.5 μm (displacement of 20 μm) and about 12.5 μm (displacement of 30 μm), it is possible to reduce the thermal resistance to a smaller level than that in a case in which the emitters 330 are not displaced at all (point A). That is, in the case of the staggered arrangement, when part of the emitter 330 of each unit transistor 110 is not covered by the bump 140, a decrease in the thermal resistance is also implemented. In this configuration, stress to be applied to the emitters 330 is reduced compared with a case in which the emitters 330 are entirely covered by the bump 140, thereby making it possible to prolong the life of the unit transistors 110.

Modified examples of the compound semiconductor device 100A will now be described below. In the following modified examples, the same elements as those of the compound semiconductor device 100A are designated by like reference numerals, and an explanation thereof will thus be omitted.

Figure 7:
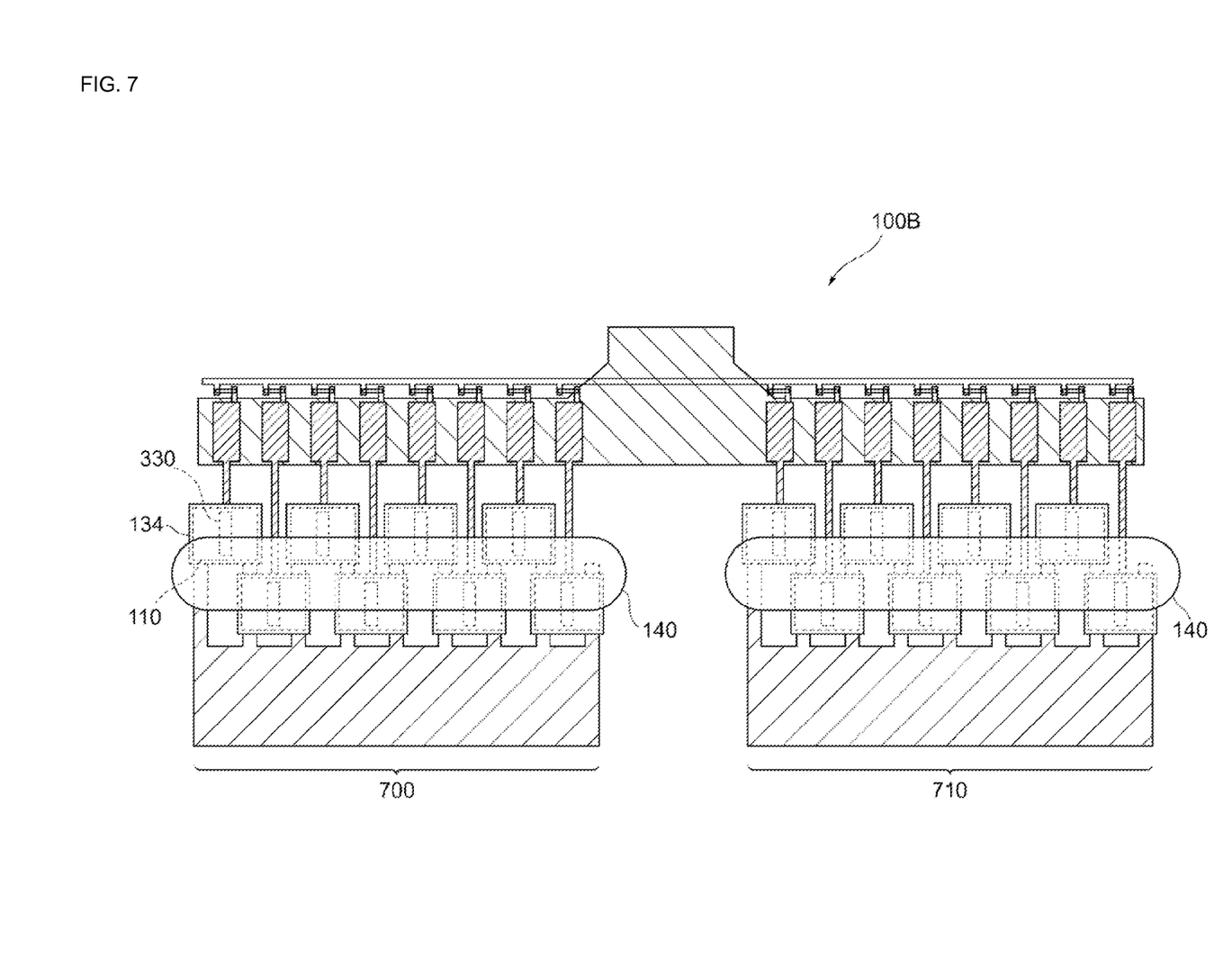
FIG. 7 is a plan view of a compound semiconductor device according to another embodiment of the disclosure.

FIG. 7 is a plan view of a compound semiconductor device 100B according to an embodiment of the disclosure. In the compound semiconductor device 100B, a plurality of unit transistors 110 are grouped into multiple blocks, and a bump 140 is provided for each block. More specifically, eight unit transistors 110 form a block 700 and the other eight unit transistors form another block 710.

Figure 8:
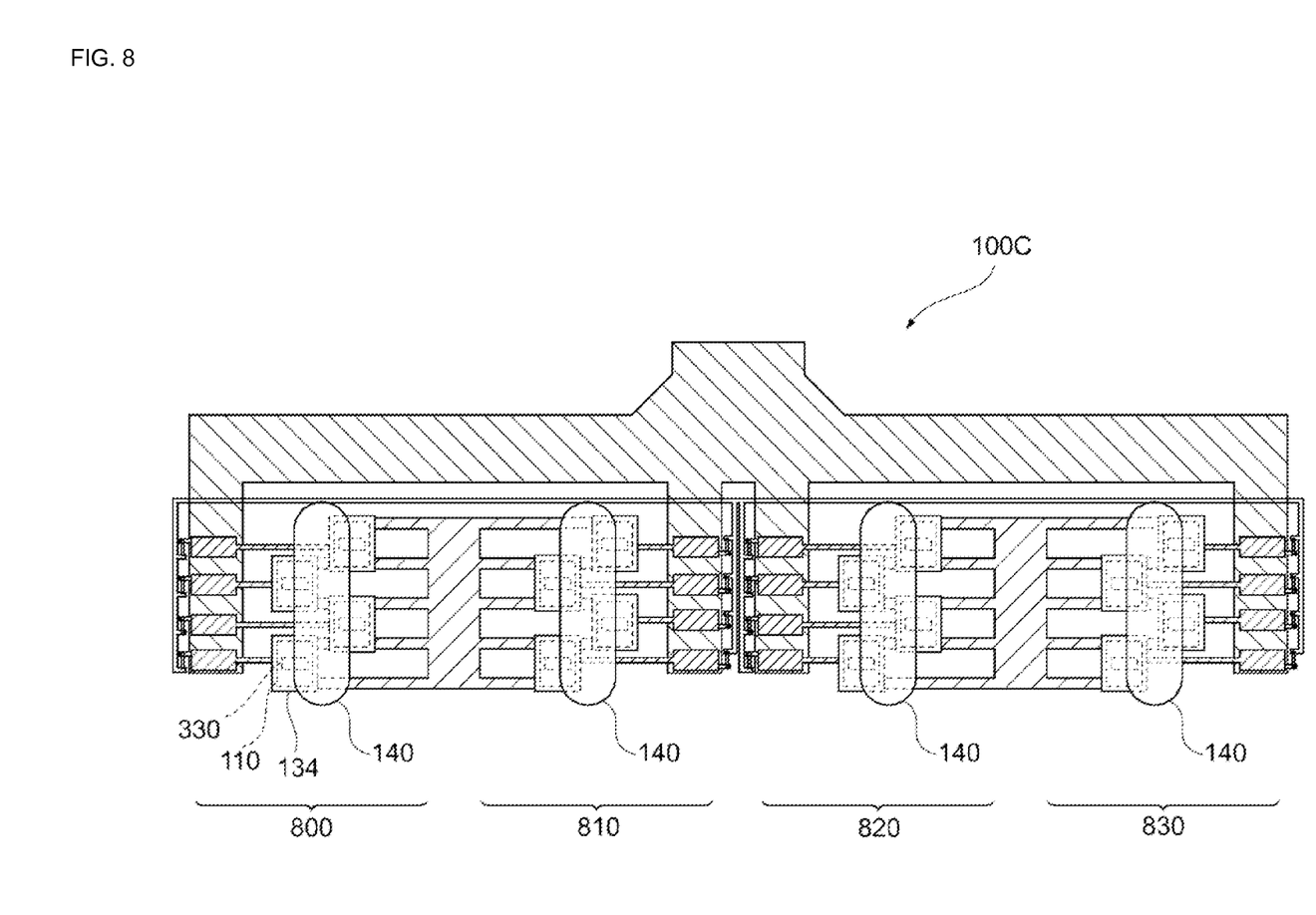
FIG. 8 is a plan view of a compound semiconductor device according to another embodiment of the disclosure.

FIG. 8 is a plan view of a compound semiconductor device 100C according to an embodiment of the disclosure. In the compound semiconductor device 100C, as well as the compound semiconductor device 100B, a plurality of unit transistors 110 are grouped into multiple blocks, and a bump 140 is provided for each block. More specifically, four unit transistors 110 form each of blocks 800, 810, 820, and 830.

Figure 9:
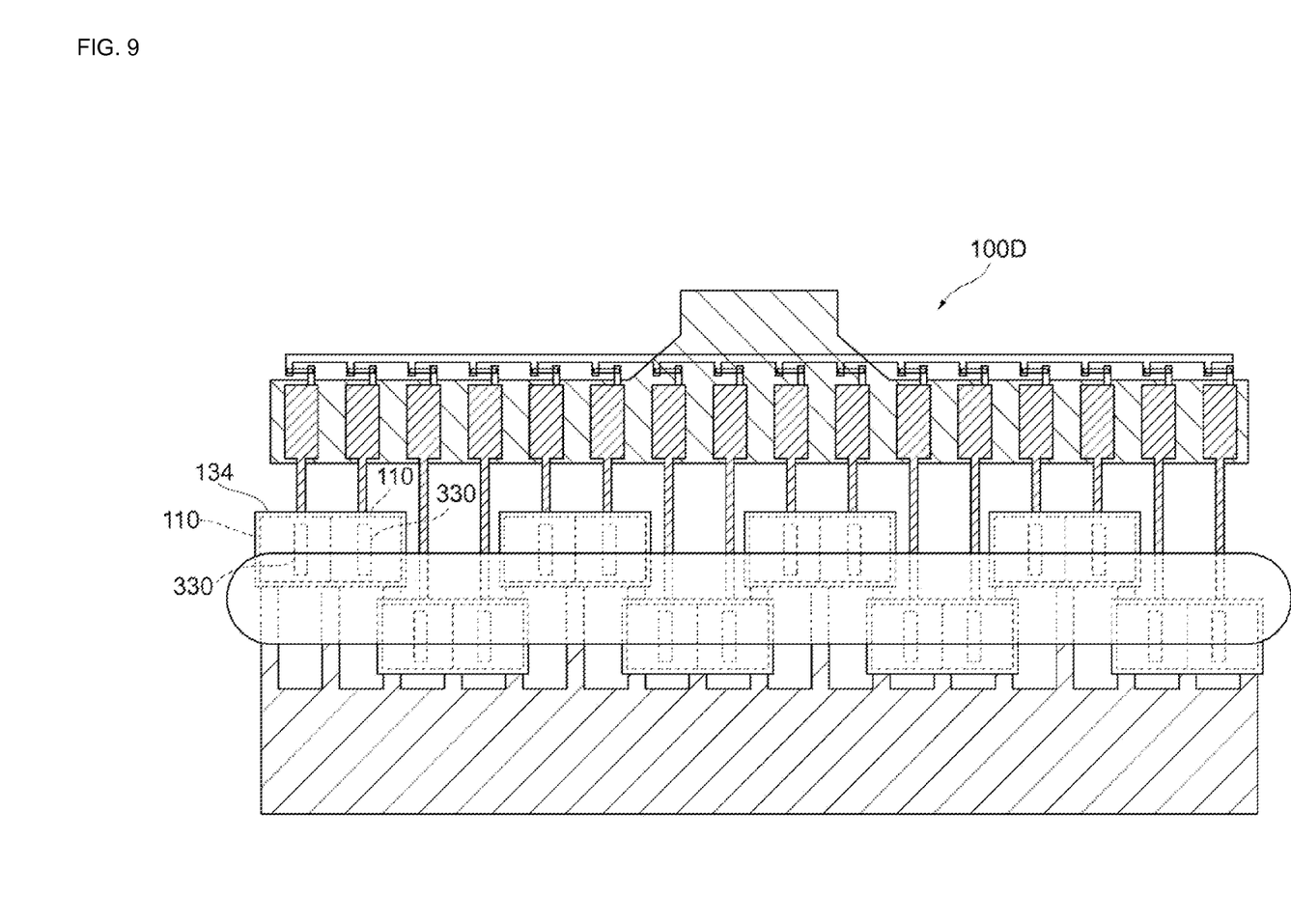
FIG. 9 is a plan view of a compound semiconductor device according to another embodiment of the disclosure.

FIG. 9 is a plan view of a compound semiconductor device 100D according to an embodiment of the disclosure. In the compound semiconductor device 100D, a plurality of unit transistors 110 are displaced from the center line of the bump alternately by the group of two unit transistors 110. In this manner, instead of being displaced alternately one by one, the emitters 330 of the unit transistors 110 may be displaced alternately by the group of multiple unit transistors 110. In the example shown in FIG. 9, two unit transistors 110 are formed into each group, but three or more unit transistors 110 may be formed into each group.

In the configurations of the compound semiconductor devices 100B through 100D shown in FIGS. 7 through 9, by displacing the emitters 330 of the unit transistors 110 from the center line 150 of the bump 140, it is possible to reduce the thermal resistance, as in the compound semiconductor device 100A.

Figure 10:
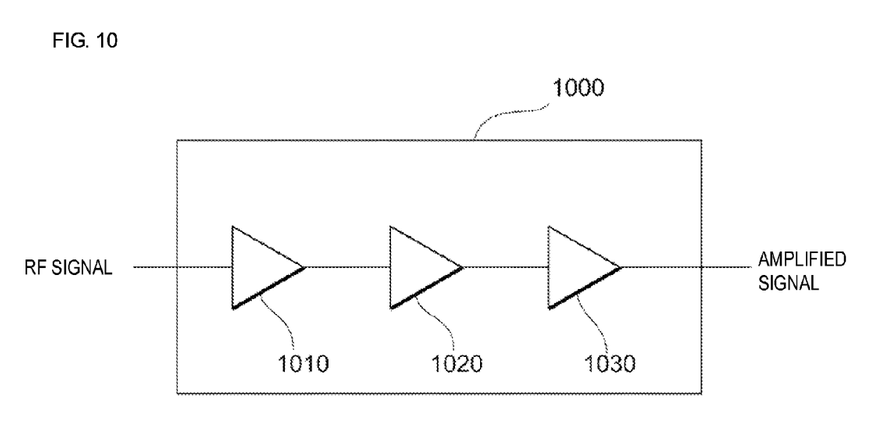
FIG. 10 illustrates the configuration of a power amplifier module according to an embodiment of the disclosure.

FIG. 10 illustrates the configuration of a power amplifier module 1000 according to an embodiment of the disclosure. The power amplifier module 1000 includes three stages of amplifiers 1010, 1020, and 1030. Each of the amplifiers 1010, 1020, and 1030 amplifies an input RF signal and outputs the amplified RF signal. In the power amplifier module 1000, the compound semiconductor device 100A is used in, for example, the amplifier 1030 at the final stage, thereby making it possible to reduce the thermal resistance in the amplifier 1030. The compound semiconductor device 100A may be used in the amplifier 1010 or 1020. However, since the current flowing through the amplifier 1030 at the final stage is greater, the effect of reducing the thermal resistance is enhanced if the compound semiconductor device 100A is used in the amplifier 1030. Instead of using the compound semiconductor device 100A, another compound semiconductor device 100B, 100C, or 100D may be used in the power amplifier module 1000.

The present disclosure has been described through illustration of preferred embodiments. According to the preferred embodiments, the emitter 330 of at least one of multiple unit transistors 110 is arranged such that it is displaced from the center line 150 of the bump 140 toward one side (first side), for example, the +Y side, and at least another one of the multiple unit transistors 110 is arranged such that it is displaced from the center line 150 of the bump 140 toward another side (second side), for example, the −Y side.

With this configuration, the positions of heat sources can be distributed more separately than the configuration in which the emitters 330 of all the unit transistors 110 are aligned along the center line 150 of the bump 140. Thus, in the compound semiconductor devices 100A through 100D, it is possible to reduce the thermal resistance to a smaller level than that in a case in which the emitters 330 of all the unit transistors 110 are aligned along the center line 150 of the bump 140.

In the compound semiconductor devices 100A through 100D, all the unit transistors 110 are displaced from the center line 150 of the bump 140. However, some unit transistors 110 may be disposed on the center line 150.

According to the preferred embodiments, the emitters 330 displaced from the center line 150 of the bump 140 may be partially exposed from the bump 140. With this configuration, stress to be applied to the emitters 330 can be reduced compared with a case in which the emitters 330 are entirely covered by the bump 140, thereby making it possible to prolong the life of the unit transistors 110.

According to the preferred embodiments, as in the compound semiconductor devices 100A, 100B, and 100C, the emitters 330 of the multiple unit transistors 110 may be displaced from the center line 150 of the bump 140 alternately toward one side (for example, the +Y side) and the other side (for example, the −Y side). With this configuration, it is possible to reduce the thermal resistance to a smaller level than that in a case in which the emitters 330 of all the unit transistors 110 are aligned along the center line 150 of the bump 140.

According to the preferred embodiments, as in the compound semiconductor device 100D, the emitters 330 of the multiple unit transistors 110 may be displaced from the center line 150 of the bump 140 toward one side (for example, the +Y side) and the other side (for example, the −Y side) alternately by the group of multiple unit transistors 110. With this configuration, it is also possible to reduce the thermal resistance to a smaller level than a case in which the emitters 330 of all the unit transistors 110 are aligned along the center line 150 of the bump 140.

According to the preferred embodiments, a power amplifier module may be formed by using the HBT of one of the compound semiconductor devices 100A through 100D as an amplifier element which amplifies an RF signal. With this configuration, a power amplifier module with a reduced level of thermal resistance can be formed. In the preferred embodiments, an example in which one of the compound semiconductor devices 100A through 100D is applied to the power amplifier module 1000 has been discussed. However, a compound semiconductor device according to an embodiment of the disclosure may find other applications than a power amplifier module.

According to the preferred embodiments, if a power amplifier module includes multiple stages of amplifiers, the HBT of one of the compound semiconductor devices 100A through 100D may be used as an amplifier element in the amplifier at the final stage. By applying one of the compound semiconductor devices 100A through 100D to the amplifier 1030 at the final stage having a greater amount of current, the effect of reducing the thermal resistance is enhanced.

The preferred embodiments described above are provided for facilitating understanding the disclosure, but are not intended to be exhaustive or to limit the disclosure to the precise forms disclosed. Modifications and/or improvements may be made to the disclosure without departing from the scope and spirit of the disclosure, and equivalents of the disclosure are also encompassed in the disclosure. That is, suitable design changes made to the preferred embodiments by those skilled in the art are also encompassed in the disclosure as long as they are within the scope and spirit of the disclosure. For example, the elements of the preferred embodiments and the positions, materials, conditions, configurations, and sizes thereof are not restricted to those described in the embodiments and may be changed in an appropriate manner. The elements of the preferred embodiments may be combined as long as such combinations are technically possible, and configurations obtained by combining the elements of the embodiments are also encompassed in the disclosure as long as they are within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A compound semiconductor device comprising:
    a heterojunction bipolar transistor including a plurality of unit transistors; and
    a bump electrically connected to emitters of the plurality of unit transistors, wherein
    the plurality of unit transistors are arranged in a first direction,
    the bump is disposed above the emitters of the plurality of unit transistors while extending in the first direction,
    the emitter of at least one of the plurality of unit transistors is displaced from a center line of the bump in the first direction toward a first side of a second direction which is perpendicular to the first direction,
    the emitter of at least another one of the plurality of unit transistors is displaced from the center line of the bump in the first direction toward a second side of the second direction,
    part of each of the emitters displaced from the center line of the bump is not covered by the bump, and
    the emitter of the at least one of the plurality of unit transistors is offset in the first direction and in the second direction with respect to the emitter of the at least another one of the plurality of unit transistors.

2. The compound semiconductor device according to claim 1, wherein the emitters of the plurality of unit transistors are displaced from the center line of the bump toward the first side and the second side alternately one by one.

3. The compound semiconductor device according to claim 1, wherein the emitters of the plurality of unit transistors are displaced from the center line of the bump toward the first side and the second side alternately by a group of a plurality of unit transistors.

4. A power amplifier module comprising:
    the compound semiconductor device according to claim 1,
    wherein the heterojunction bipolar transistor is an amplifier element which amplifies a radio-frequency signal.

5. The power amplifier module according to claim 4, wherein:
    the power amplifier module includes a plurality of stages of amplifiers; and
    the heterojunction bipolar transistor is the amplifier element of the amplifier at a final stage among the plurality of stages of amplifiers.

6. The compound semiconductor device according to claim 1, wherein the emitters of the plurality of unit transistors are displaced from the center line of the bump toward the first side and the second side alternately one by one.

7. The compound semiconductor device according to claim 1, wherein the emitters of the plurality of unit transistors are displaced from the center line of the bump toward the first side and the second side alternately by a group of a plurality of unit transistors.

8. A power amplifier module comprising:
    the compound semiconductor device according to claim 1,
    wherein the heterojunction bipolar transistor is an amplifier element which amplifies a radio-frequency signal.

9. A power amplifier module comprising:
    the compound semiconductor device according to claim 2,
    wherein the heterojunction bipolar transistor is an amplifier element which amplifies a radio-frequency signal.

10. A power amplifier module comprising:
    the compound semiconductor device according to claim 3,
    wherein the heterojunction bipolar transistor is an amplifier element which amplifies a radio-frequency signal.

11. A power amplifier module comprising:
    the compound semiconductor device according to claim 6,
    wherein the heterojunction bipolar transistor is an amplifier element which amplifies a radio-frequency signal.

12. A power amplifier module comprising:
    the compound semiconductor device according to claim 7,
    wherein the heterojunction bipolar transistor is an amplifier element which amplifies a radio-frequency signal.

13. The power amplifier module according to claim 8, wherein:
    the power amplifier module includes a plurality of stages of amplifiers; and
    the heterojunction bipolar transistor is the amplifier element of the amplifier at a final stage among the plurality of stages of amplifiers.

14. The power amplifier module according to claim 9, wherein:
    the power amplifier module includes a plurality of stages of amplifiers; and
    the heterojunction bipolar transistor is the amplifier element of the amplifier at a final stage among the plurality of stages of amplifiers.

15. The power amplifier module according to claim 10, wherein:
    the power amplifier module includes a plurality of stages of amplifiers; and
    the heterojunction bipolar transistor is the amplifier element of the amplifier at a final stage among the plurality of stages of amplifiers.

16. The power amplifier module according to claim 11, wherein:
    the power amplifier module includes a plurality of stages of amplifiers; and
    the heterojunction bipolar transistor is the amplifier element of the amplifier at a final stage among the plurality of stages of amplifiers.

17. The power amplifier module according to claim 12, wherein:
    the power amplifier module includes a plurality of stages of amplifiers; and
    the heterojunction bipolar transistor is the amplifier element of the amplifier at a final stage among the plurality of stages of amplifiers.

18. The compound semiconductor device according to claim 1, wherein each of a plurality of capacitors is connected to a base of each of the plurality of unit transistors.

19. The compound semiconductor device according to claim 18, wherein each of the plurality of capacitors is not covered by the bump.

20. The compound semiconductor device according to claim 18, wherein the plurality of capacitors are arranged in the first direction and are not displaced from the center line of the bump towards the first side and the second side alternately one by one.

* * * * *